(12) United States Patent
Seo et al.

(10) Patent No.: US 11,177,337 B2
(45) Date of Patent: Nov. 16, 2021

(54) DISPLAY APPARATUS AND METHOD OF MANUFACTURING THE SAME

(71) Applicant: Samsung Display Co., Ltd., Yongin-si (KR)

(72) Inventors: Youngwan Seo, Yongin-si (KR); Hyeongseok Kim, Yongin-si (KR); Cheolgon Lee, Yongin-si (KR); Meehye Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/738,578

(22) Filed: Jan. 9, 2020

(65) Prior Publication Data

US 2020/0411625 A1  Dec. 31, 2020

(30) Foreign Application Priority Data

Jun. 25, 2019  (KR) .................. 10-2019-0075780

(51) Int. Cl.
- *H01L 27/32* (2006.01)
- *G09G 3/3266* (2016.01)
- *G09G 3/3291* (2016.01)
- *G02F 1/1345* (2006.01)
- *H01L 27/12* (2006.01)

(52) U.S. Cl.
CPC ........ *H01L 27/3276* (2013.01); *G02F 1/1345* (2013.01); *G02F 1/13452* (2013.01); *G09G 3/3266* (2013.01); *G09G 3/3291* (2013.01); *H01L 27/124* (2013.01); *H01L 27/3288* (2013.01)

(58) Field of Classification Search
CPC ............ H01L 27/3276; H01L 27/3288; H01L 27/3297; H01L 27/124
See application file for complete search history.

(56) References Cited

U.S. PATENT DOCUMENTS

| | | | |
|---|---|---|---|
| 8,350,792 B2* | 1/2013 | Igeta | G02F 1/136286 345/87 |
| 9,231,000 B2 | 1/2016 | Ko et al. | |
| 9,685,131 B2 | 6/2017 | Tanaka et al. | |
| 2008/0225216 A1* | 9/2008 | Shimodaira | G02F 1/1362 349/143 |
| 2013/0271440 A1 | 10/2013 | Jin et al. | |
| 2016/0055794 A1* | 2/2016 | Lee | G09G 3/3266 345/212 |
| 2017/0294502 A1* | 10/2017 | Ka | H01L 27/3258 |
| 2019/0051670 A1* | 2/2019 | Bei | H01L 27/3276 |
| 2019/0245020 A1 | 8/2019 | Choi et al. | |

FOREIGN PATENT DOCUMENTS

| | | |
|---|---|---|
| JP | 2005-046352 | 2/2005 |
| JP | 2010-032760 | 2/2010 |
| KR | 10-2014-0108023 | 9/2014 |
| KR | 10-2017-0066767 | 6/2017 |
| KR | 10-1902500 | 10/2018 |

* cited by examiner

*Primary Examiner* — Tuan A Hoang
(74) *Attorney, Agent, or Firm* — Kile Park Reed & Houtteman PLLC

(57) ABSTRACT

A display apparatus includes a display area on a substrate, and in which pixels are arranged; a transmission area in the display area around which the pixels are disposed; a divided data line and constant voltage lines passing through the pixels; and a bypass line connecting the data line and bypassing the transmission area, wherein the bypass line overlaps the constant voltage line.

20 Claims, 12 Drawing Sheets

DISPLAY APPARATUS AND METHOD OF MANUFACTURING THE SAME

CROSS-REFERENCE TO RELATED APPLICATION

This application claims priority to and the benefits of Korean Patent Applications No. 10-2019-0075780, filed on Jun. 25, 2019 in the Korean Intellectual Property Office, the entire disclosure of which is incorporated herein by reference.

BACKGROUND

1. Technical Field

One or more embodiments relate to a display apparatus and a method of manufacturing the display apparatus to include a maximized display area around a transmission area of the display apparatus.

2. Description of the Related Art

Display apparatuses continue to be used for various purposes, and since the thickness and weight of the display apparatuses continue to be reduced, the scope of applications implementing such display apparatuses has grown.

Relative to the types and purposes of those applications, different methods of designing a shape of a display apparatus continue to be developed as a result of the need to accommodate functionality of the display apparatus for a given application.

SUMMARY

One or more embodiments provide a display apparatus including a sensor area in a display area, and on which a component such as a sensor may be arranged, and a method of manufacturing the display apparatus. One or more embodiments also provide a display apparatus having an improved configuration, in which a dead space around a through hole, through which a signal from a component may be transmitted, may be reduced, and a method of manufacturing the display apparatus. However, the scope of the disclosure may not be limited thereto.

Additional aspects may be set forth in the description which follows and may be apparent from the description, or may be learned by practice of the embodiments of the disclosure.

According to an embodiment, a display apparatus may include a substrate; a display area on the substrate, and in which pixels may be arranged; a transmission area in the display area, and the pixels being around the transmission area; a data line and constant voltage lines passing through the, the data line being divided into portions thereof; and a bypass line connecting the portions of the data line and bypassing the transmission area, wherein the bypass line may overlap the constant voltage line.

The bypass line may bypass the transmission area along a path having an alternating direction.

The alternating direction may include a pair of turns.

The constant voltage lines may include a first constant voltage line and a second constant voltage line, wherein the first constant voltage line may pass through the pixels in a first direction and the second constant voltage line passes through the pixels in a second direction that intersects with the first direction, and the data line may be in parallel with the second constant voltage line in the second direction.

First constant voltage lines may pass through each pixel in the first direction.

The first constant voltage lines may include an initialization voltage line that supplies an initialization voltage to each pixel.

The first constant voltage lines may include an initialization voltage line and a driving voltage line, wherein the initialization voltage line may supply an initialization voltage to each pixel and the driving voltage line may supply a driving voltage to each pixel.

The second constant voltage line may include a driving voltage line that may supply a driving voltage to each pixel.

The display apparatus may further include signal lines passing through the pixels in the first direction.

The signal lines may include a scan line supplying a scan signal to each pixel; and an emission control line supplying an emission control signal to each pixel.

The signal line and the emission control line may each be divided into two portions, each of which may be disposed at an opposite side of the transmission area.

The two divided portions of each of the scan line and the emission control line may be connected to each other via another bypass line overlapping the constant voltage lines.

According to an embodiment, a method of manufacturing a display apparatus may include forming a display area on a substrate, wherein pixels may be arranged in the display area; forming a transmission area in the display area, in which the pixels may be around the transmission area; arranging a data line and constant voltage lines that may pass through the pixels, the data line being divided into portions thereof; and connecting the portions of the data line via a bypass line that may bypass the transmission area, wherein the bypass line may overlap the constant voltage lines.

The bypass line may bypass the transmission area along a path having an alternating direction.

The alternating direction may include a pair of turns.

The constant voltage lines may include a first constant voltage line and a second constant voltage line, wherein the first constant voltage line may pass through the pixels in a first direction and the second constant voltage line passes through the pixels in a second direction that intersects with the first direction, and the data line may be in parallel with the second constant voltage line in the second direction.

First constant voltage lines may pass through each pixel in the first direction.

The first constant voltage lines may include initialization voltage lines that supply initialization voltages to each pixel.

The first constant voltage lines may include an initialization voltage line and a driving voltage line, wherein the initialization voltage line may supply an initialization voltage to each pixel and the driving voltage line may supply a driving voltage to each pixel.

The second constant voltage line may include a driving voltage line that may supply a driving voltage to each pixel.

BRIEF DESCRIPTION OF THE DRAWINGS

The above and other aspects, features, and advantages of embodiments of the disclosure will be more apparent from the following description when taken in conjunction with the accompanying drawings, in which.

DETAILED DESCRIPTION

Figure 1:
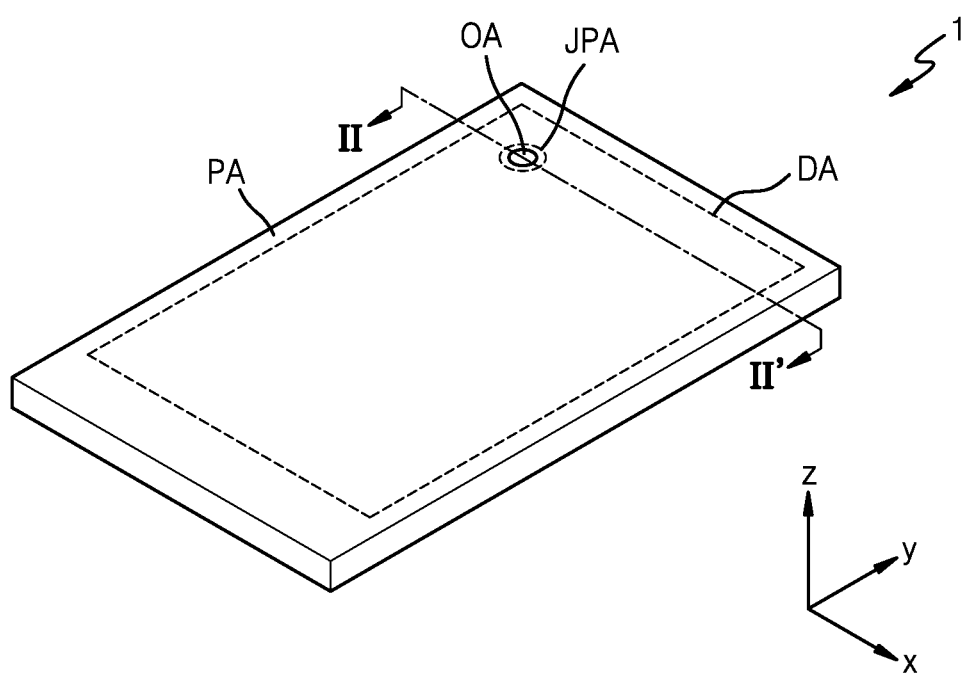
FIG. 1 shows a perspective view of a display apparatus according to an embodiment.

Reference will now be made to embodiments, examples of which may be illustrated in the accompanying drawings, wherein like reference numerals refer to like elements throughout. In this regard, the embodiments may have different forms and should not be construed as being limited to the descriptions set forth herein. Accordingly, the embodiments may be described below, by referring to the figures, to explain aspects of the description. As used herein, the term "and/or" may include any and all combinations of one or more of the associated listed items. Expressions such as "at least one of," when preceding a list of elements, modify the entire list of elements and do not modify the individual elements of the list.

An expression used in the singular encompasses the expression of the plural, unless it may have a clearly different meaning in context.

It may be understood that the terms "including," "having," and "comprising" indicate the existence of the features, numbers, steps, actions, components, parts, or combinations thereof disclosed in the specification, and may not be intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings may be arbitrarily illustrated for convenience of explanation, the following embodiments may not be limited thereto.

In a case that a certain embodiment may be implemented differently, a specific process order may be performed differently from the described order. For example, two consecutively described processes may be performed substantially at the same time or performed in an order opposite to the described order.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, it can be directly or indirectly formed on the other layer, area, or component. That is, for example, intervening layers, areas, or components may be present.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, in the specification, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 shows a perspective view of a display apparatus 1 according to an embodiment.

Referring to FIG. 1, the display apparatus 1 may include a transmission area OA and a display area DA surrounding or around a periphery of the transmission area OA. The display apparatus 1 may provide a predetermined image via light emitted from pixels arranged in the display area DA. FIG. 1 shows that one transmission area OA may be in the display area DA, and the transmission area OA may be surrounded by the pixels P (see FIG. 6) in the display area DA, wherein the pixels P may be around a periphery of the transmission area OA. The transmission area OA may be an area in which a component, as described below with reference to FIGS. 2A and 2B, may be arranged.

A bypass area JPA may be between the transmission area OA and the display area DA, and the display area DA may be surrounded by a peripheral area PA, wherein the peripheral area PA may be around a periphery of the display area DA. The peripheral area PA may be a non-display area on which pixels may not be arranged. The bypass area JPA may be included in the display area DA. In the bypass area JPA, a data line DL (see FIG. 6) connecting to each pixel P may be connected via a bypass line J (see FIG. 6) so as to avoid the data line DL traversing the transmission area OA. A discussion of an arrangement of wirings around the transmission area OA and within the bypass area JPA follows below with reference to FIGS. 6 to 8.

The display apparatus 1 may be an organic light-emitting display apparatus, but may not be limited thereto. In another embodiment, the display apparatus 1 may include an inorganic light-emitting display apparatus or a quantum dot light-emitting display apparatus. For example, a light-emitting layer of a display element included in the display apparatus 1 may include an organic material, an inorganic material, quantum dots, an organic material and quantum dots, or an inorganic material and quantum dots.

FIG. 1 shows that one transmission area OA may be provided and that the transmission area OA may have a circular shape, but one or more embodiments may not be limited thereto. For example, two or more transmission areas OA may be provided, and each transmission area OA may have shapes such as a circular shape, an elliptic shape, a polygonal shape, a star shape, a diamond shape, etc.

Figure 2A:
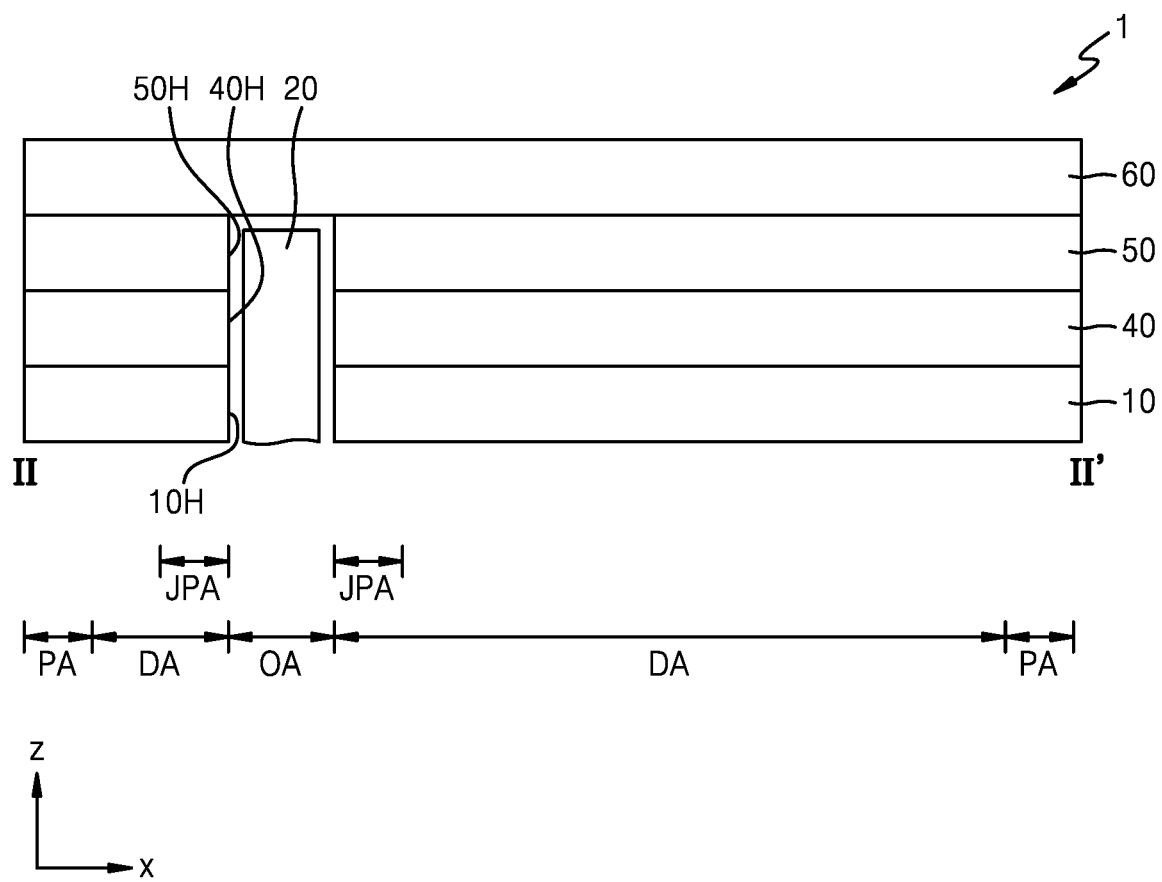
FIGS. 2A and 2B show schematic cross-sectional views of a display apparatus according to an embodiment.
Figure 2B:
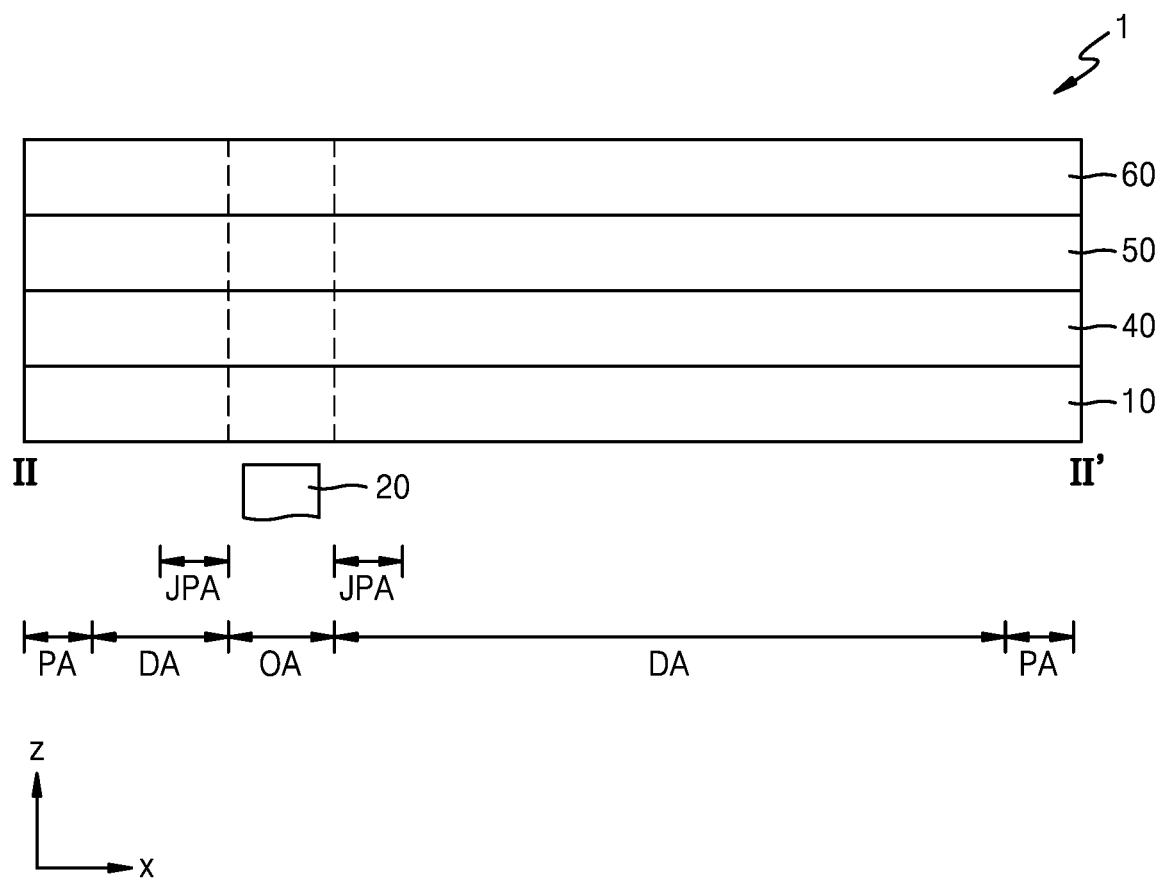

FIGS. 2A and 2B show schematic cross-sectional views of the display apparatus 1 according to the embodiment, and may correspond to a cross-section taken along line II-II' of FIG. 1.

Referring to FIG. 2A, the display apparatus 1 may include a display panel 10, an input sensing layer 40 on the display panel 10, and an optical functional layer 50, which may be covered by a window 60. The display apparatus 1 may include various electronic devices such as a mobile phone, a laptop computer, a smart watch, etc.

The display panel 10 may display images. The display panel 10 may include pixels arranged in the display area DA. Each of the pixels may include a display element and a pixel circuit connected to the display element. The display element may include an organic light-emitting diode, a quantum-dot organic light-emitting diode, etc.

The input sensing layer 40 may obtain coordinate information generated according to an external input, e.g., a touch event. The input sensing layer 40 may include a sensing electrode (or touch electrode) and trace lines connected to the sensing electrode. The input sensing layer 40 may be arranged on the display panel 10. The input sensing layer 40 may sense an external input by a mutual capacitance method and/or a self-capacitance method.

The input sensing layer 40 may be directly arranged on the display panel 10, or may be separately formed and then bonded to the display panel 10 via an adhesive layer such as an optical clear adhesive (OCA). For example, the input sensing layer 40 may be successively formed after the process of forming the display panel 10, and the input sensing layer 40 may thus be understood as forming a part of the display panel 10 and the adhesive layer may not be provided between the input sensing layer 40 and the display panel 10. FIG. 2A shows that the input sensing layer 40 may be arranged between the display panel 10 and the optical functional layer 50, but in another embodiment, the input sensing layer 40 may be arranged on the optical functional layer 50.

The optical functional layer 50 may include an anti-reflection layer. The anti-reflection layer may reduce a reflectivity of light incident to the display panel 10 from outside (external light) via the window 60. The anti-reflection layer may include a retarder and a polarizer. The retarder may be of a film type or a liquid crystal coating type and may include a $\lambda/2$ retarder and/or a $\lambda/4$ retarder. The polarizer may be of a film type or a liquid crystal coating type. The film-type polarizer may include a stretched synthetic resin film, and the liquid crystal coating-type polarizer may include liquid crystals arranged in a predetermined orientation. The retarder and the polarizer may include a protective film. The protective film of the retarder and the polarizer may be defined as a base layer of the anti-reflection layer.

In another embodiment, the anti-reflection layer may include a black matrix and color filters. The color filters may be arranged to account for a color of light that may be emitted from each of the pixels in the display panel 10. Each of the color filters may include red, green, or blue pigment or dye. As another example, each of the color filters may include quantum dots in addition to the pigment or dye. As yet another example, some of the color filters may not include the pigment or dye mentioned above, but may include scattering particles such as titanium oxide.

In another embodiment, the anti-reflection layer may include a destructive interference structure. The destructive interference structure may include a first reflective layer and a second reflective layer arranged on different layers. First reflected light and second reflected light that may be respectively reflected by the first reflective layer and the second reflective layer may destructively interfere with each other, and accordingly, a reflectivity of external light may be reduced.

The optical functional layer 50 may include a lens layer. The lens layer may improve light-emitting efficiency of light emitted from the display panel 10 or may reduce color difference. The lens layer may include a layer having a concave or a convex lens shape and/or may include layers having different refractive indices. The optical functional layer 50 may include both the anti-reflection layer and the lens layer or may include either the anti-reflection layer or the lens layer.

In an embodiment, the optical functional layer 50 may be successively formed after the process of forming the display panel 10 and/or the input sensing layer 40. Thus, the adhesive layer may not be provided between the optical functional layer 50 and the display panel 10 and/or the input sensing layer 40.

The display panel 10, the input sensing layer 40, and/or the optical functional layer 50 may each include an opening. Regarding this, FIG. 2A shows that the display panel 10, the input sensing layer 40, and the optical functional layer 50 respectively include first to third openings 10H, 40H, and 50H that overlap or face one another. The first to third openings 10H, 40H, and 50H may be located to correspond to the transmission area OA. In another embodiment, one or more of the display panel 10, the input sensing layer 40, and the optical functional layer 50 may not include an opening. For example, one or two elements selected from the display panel 10, the input sensing layer 40, and the optical functional layer 50 may not include an opening. As another example, the display panel 10, the input sensing layer 40, and the optical functional layer 50 may not include an opening as shown in FIG. 2B.

As described above, the transmission area OA may include or be associated with a predetermined component so as to define a region relating thereto, e.g., a sensor region, a camera region, a speaker region, etc. The region may include a component 20 for adding various functions to the display apparatus 1. The component 20 may be located in the first to third openings 10H, 40H, and 50H as shown in FIG. 2A. As another example, the component 20 may be under the display panel 10 as shown in FIG. 2B.

The component 20 may include an electronic element. For example, the component 20 may be an electronic element that may use light or sound. For example, the electronic element may include a sensor outputting and/or receiving light such as an infrared-ray (IR) sensor, a camera capturing an image by receiving light, a sensor for outputting and sensing light or sound to measure a distance or recognize a fingerprint, a small-sized lamp illuminating light, a speaker for outputting sound, etc. The electronic element using light may use light of various wavelength bands such as visible light, IR light, ultraviolet (UV) rays, etc. In some embodiments, the transmission area OA may be considered as an area through which light and/or sound output from the component 20 or proceeding towards the electronic element may pass from the outside.

In another embodiment, in a case that the display apparatus 1 may be used in a smart watch or an instrument panel for a vehicle, the component 20 may include a member having a clock needle or a needle indicating predetermined information (e.g., vehicle velocity, etc.). In a case that the display apparatus 1 may include a clock needle or an instrument panel for a vehicle, the component 20 may be exposed to the outside after penetrating through the window 60 and the window 60 may include an opening corresponding to the transmission area OA.

The component 20 may include element(s) related to functions of the display panel 10 as described above, or may include element(s) such as an accessory increasing aesthetic appearance of the display panel 10. Although not shown in FIGS. 2A and 2B, an OCA, etc., may be between the window 60 and the optical functional layer 50.

FIGS. 3A to 3D show schematic cross-sectional views of the display panel 10 according to the embodiment.

Figure 3A:
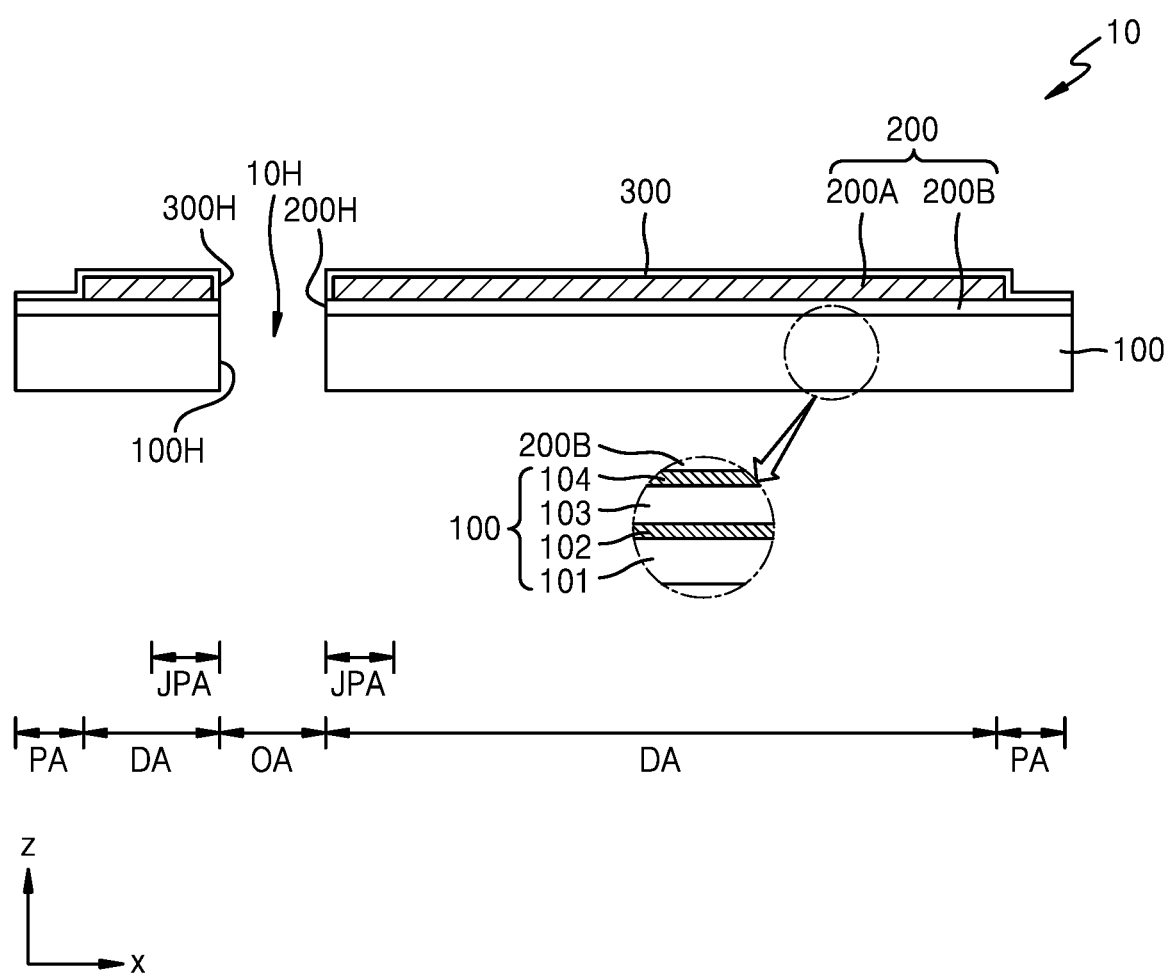
FIGS. 3A to 3C show schematic cross-sectional views of a display apparatus according to another embodiment.

Referring to FIG. 3A, the display panel 10 may include a display layer 200 on the substrate 100. The substrate 100 may include glass or a polymer resin. The substrate 100 may have a multi-layered structure. For example, as shown in an enlarged view of FIG. 3A, the substrate 100 may include a first base layer 101, a first barrier layer 102, a second base layer 103, and a second barrier layer 104.

The first and second base layers 101 and 103 may each include a polymer resin. For example, the first and second base layers 101 and 103 may each include a polymer resin such as a polyether sulfone (PES), polyarylate (PAR), polyetherimide (PEI), polyethylene naphthalate (PEN), polyethylene terephthalate (PET), polyphynylene sulfide (PPS), polyimide (PI), polycarbonate (PC), cellulose triacetate (TAC), cellulose acetate propionate (CAP), etc. The first and second base layers 101 and 103 may each include a transparent polymer resin.

The first barrier layer 102 and the second barrier layer 104 may prevent infiltration of external impurities and may have a single-layered or multi-layered structure including an inorganic material such as silicon nitride and silicon oxide.

The display layer 200 may include pixels. The display layer 200 may include a display element layer 200A and a pixel circuit layer 200B, wherein the display element layer 200A may include display elements in each pixel and the pixel circuit layer 200B may include a pixel circuit and insulating layers in each pixel. Each pixel circuit may include a transistor and a storage capacitor, and each display element may include an organic light-emitting diode OLED.

The display elements in the display layer 200 may be covered by an encapsulation member such as a thin film encapsulation layer 300, and the thin film encapsulation layer 300 may include at least one inorganic encapsulation layer and at least one organic encapsulation layer. In a case that the display panel 10 may include the substrate 100 and the thin film encapsulation layer 300, wherein the substrate 100 may include the polymer resin and the thin film encapsulation layer 300 may include the inorganic encapsulation layer and the organic encapsulation layer, the display panel 10 may have an improved flexibility.

The display panel 10 may include an opening 10H penetrating through the display panel 10. The opening 10H may be in the transmission area OA. FIG. 3A shows that the substrate 100 and the thin film encapsulation layer 300 respectively include through holes 100H and 300H that correspond to the opening 10H of the display panel 10. The display layer 200 may include a through hole 200H corresponding to the transmission area OA.

Figure 3B:
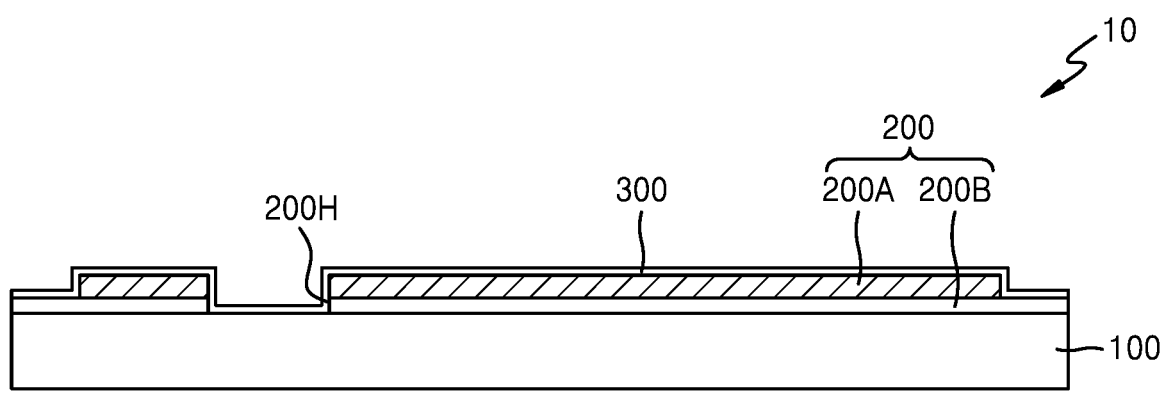
Figure 3B:
Figure 3B:
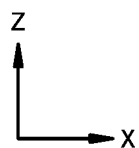
Figure 3C:
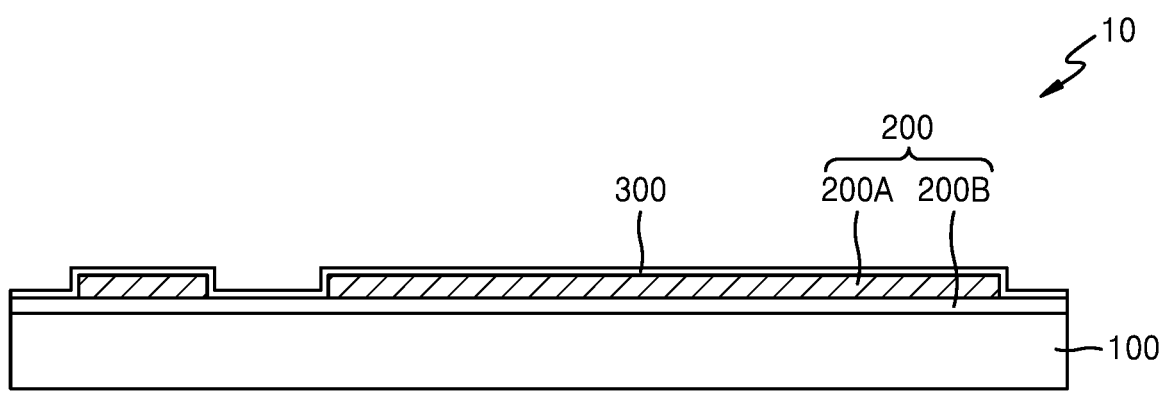
Figure 3C:
Figure 3C:
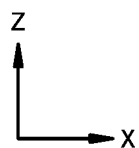

In another embodiment, as shown in FIG. 3B, the substrate 100 may not include a through hole corresponding to the transmission area OA. The display layer 200 may include the through hole 200H corresponding to the transmission area OA. The thin film encapsulation layer 300 may not include a through hole corresponding to the transmission area OA. In another embodiment, as shown in FIG. 3C, the display layer 200 may not include the through hole 200H corresponding to the transmission area OA and the display element layer 200A may not be in the transmission area OA.

The transmission area OA may be provided as a through hole or a groove.

Figure 4:
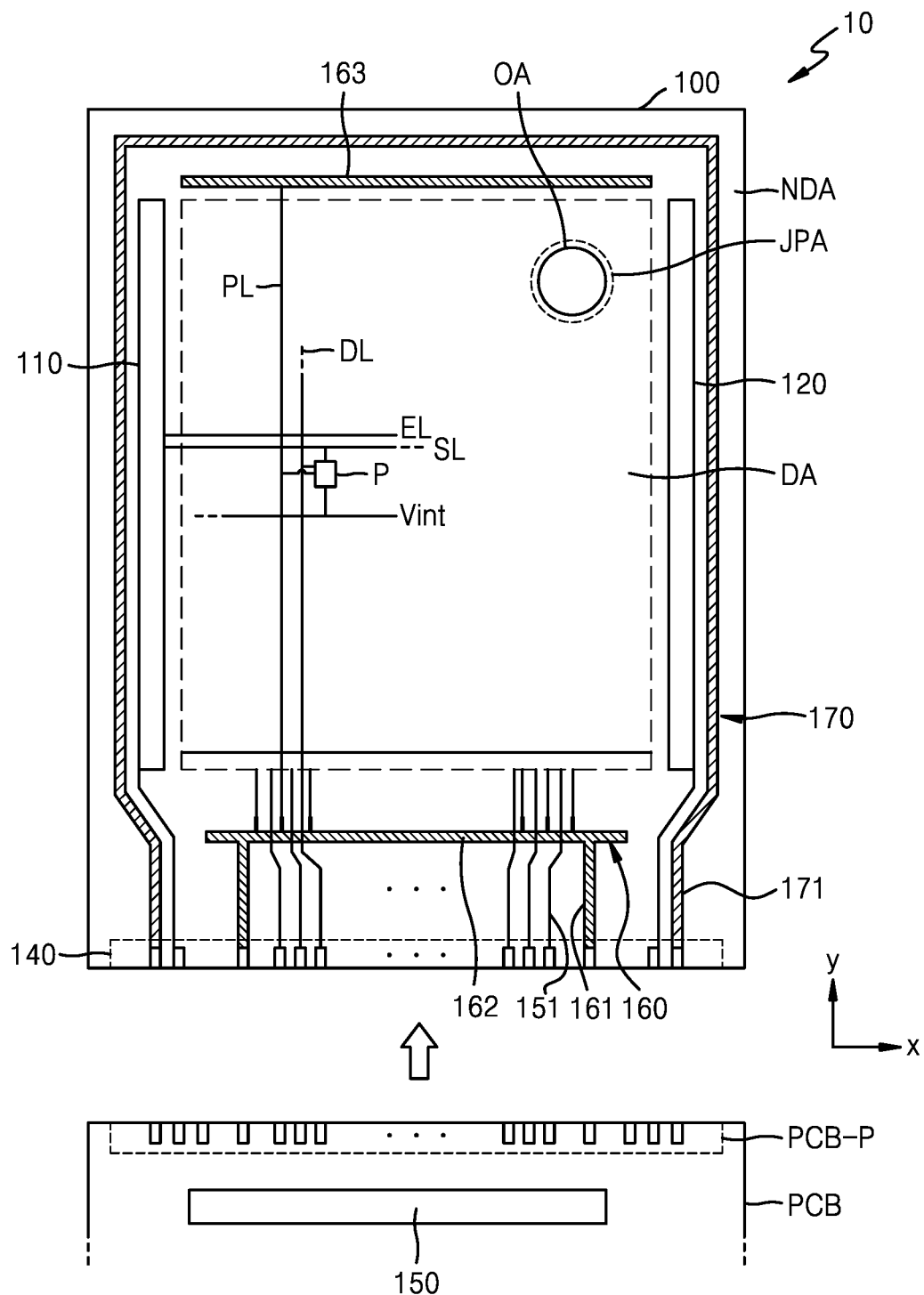
FIG. 4 shows a plan view of the display panel according to an embodiment.

FIG. 4 shows a plan view of the display panel 10 according to an embodiment.

Referring to FIG. 4, the display panel 10 may include pixels P arranged in the display area DA. The pixels P may each include a display element such as an organic light-emitting diode. Each of the pixels P may emit light, e.g., red light, green light, blue light, or white light, from the organic light-emitting diode. The pixel P may emit red light, green light, blue light, or white light, as described above. The display area DA may be covered by the encapsulation member described above with reference to FIGS. 2A to 3C, so as to be protected against external air or moisture.

The transmission area OA may be arranged in an inner portion of the display area DA, and the pixels P may be arranged around the transmission area OA. The pixels P may be arranged to surround or be around a periphery of the transmission area OA, and the bypass area JPA described above may be located around the transmission area OA. In the bypass area JPA, a data line DL that may be divided due to positioning of the transmission area OA may be connected indirectly, i.e., portions of the data line DL may be connected notwithstanding the positioning of the transmission area, as described below with reference to FIG. 6.

Each pixel P may be electrically connected to external circuits arranged in a non-display area NDA that may correspond to the peripheral area PA of FIG. 1. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide each pixel P with a scan signal via a scan line SL. The first scan driving circuit 110 may provide each pixel P with an emission control signal via an emission control line EL. The second scan driving circuit 120 may be arranged in parallel with the first scan driving circuit 110, with the display area DA being arranged therebetween. Some of the pixels P arranged in the display area DA may be electrically connected to the first scan driving circuit 110, and others of the pixels P may be connected to the second scan driving circuit 120.

The terminal 140 may be arranged at a side of the substrate 100. The terminal 140 may not be covered by an insulating layer, but may be exposed and may be electrically connected to a printed circuit board PCB. A terminal PCB-P of the printed circuit board PCB may be electrically connected to the terminal 140 of the display panel 10. The printed circuit board PCB may transfer a signal or power from a controller (not shown) to the display panel 10. A control signal generated by the controller may be respectively transferred to the first and second scan driving circuits 110 and 120 via the printed circuit board PCB. The controller may provide the first and second power supply lines 160 and 170 respectively with first and second power voltages ELVDD and ELVSS (see FIG. 5) via first and second connecting lines 161 and 171. The first power voltage ELVDD may be supplied to each pixel Pm or Pa via a driving voltage line PL connected to the first power supply line 160, and the second power voltage ELVSS may be provided to an opposite electrode (not shown) of each pixel P connected to the second power supply line 170.

The data driving circuit 150 may be electrically connected to a data line DL. A data signal of the data driving circuit 150 may be provided to each of the pixels P via a connecting line 151 connected to the terminal 140 and the data line DL connected to the connecting line 151. Although FIG. 4 shows that the data driving circuit 150 may be arranged on the printed circuit board PCB, the data driving circuit 150 may be arranged on the substrate 100, in another embodiment. For example, the data driving circuit 150 may be arranged between the terminal 140 and the first power supply line 160.

The first power supply line 160 may include a first sub-line 162 and a second sub-line 163 that may extend in parallel with each other along an X-direction, with the display area DA therebetween. The second power supply line 170 may have a loop shape having an opening side to partially surround or be around a periphery of the display area DA.

Figure 5:
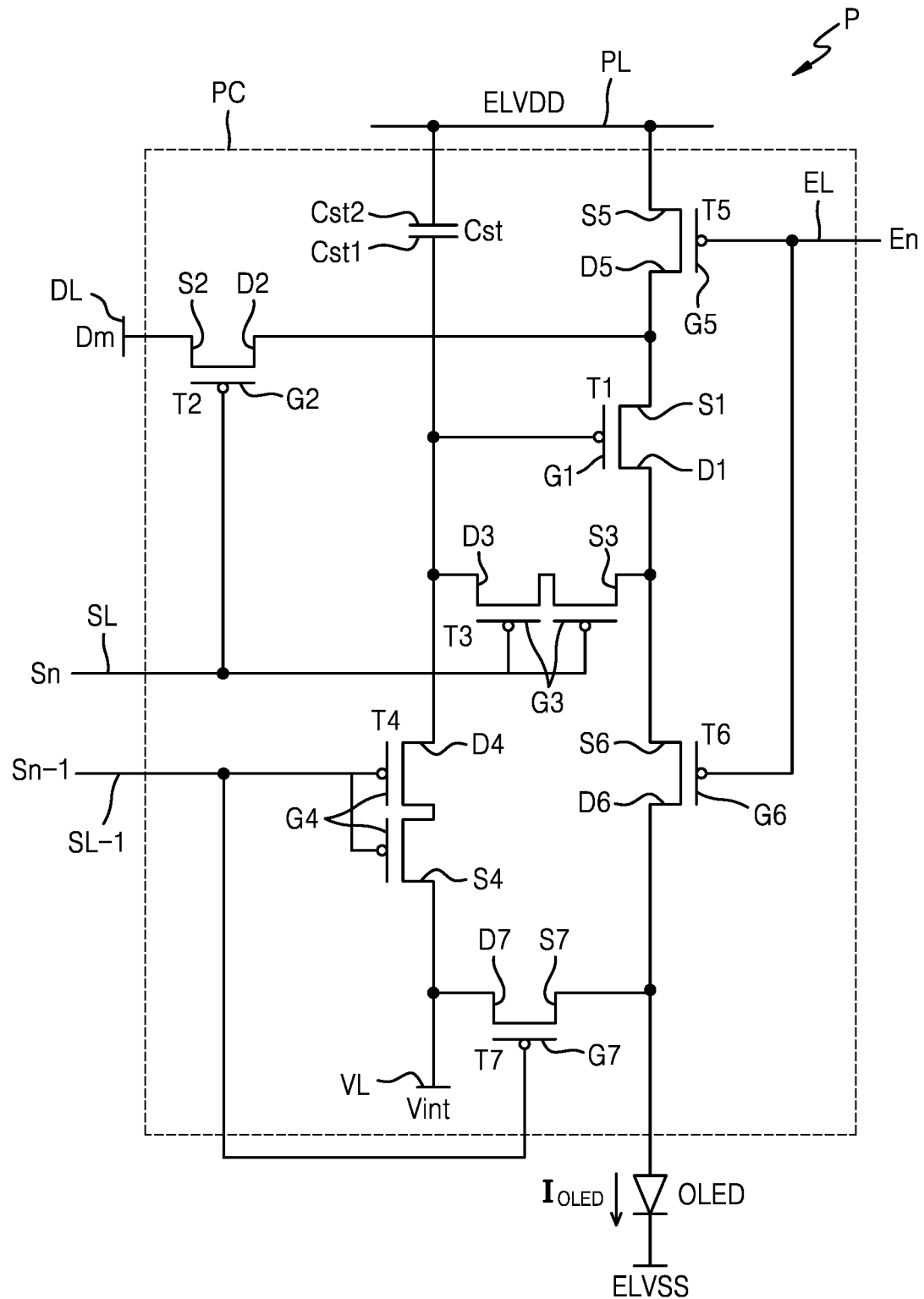
FIG. 5 shows a schematic diagram of equivalent circuit one of a pixel in a display panel according to an embodiment.

FIG. 5 shows a schematic diagram of an equivalent circuit of a pixel P in a display panel according to an embodiment.

Referring to FIG. 5, the pixel P may include a pixel circuit PC and an organic light-emitting diode OLED connected to the pixel circuit PC. The pixel circuit PC may include thin film transistors and a storage capacitor. The thin film transistors and the storage capacitor may be connected to signal lines SL, SL-1, EL, and DL, an initialization voltage line Vint, and a driving voltage line PL.

In FIG. 5, each pixel P may be connected to the signal lines SL, SL-1, EL, and DL, the initialization voltage line Vint, and the driving voltage line PL, but one or more embodiments may not be limited thereto. As another embodiment, at least one of the signal lines SL, SL-1, EL, and DL, the initialization voltage line Vint, and the driving voltage line PL may be shared by neighboring pixels P.

The thin film transistors may include a driving TFT T1, a switching TFT T2, a compensation TFT T3, a first initialization TFT T4, an operation control TFT T5, an emission control TFT T6, and a second initialization TFT T7.

The signal lines may include the scan line SL transferring a scan signal Sn, a previous scan line SL-1 transferring a previous scan signal Sn-1 to the first initialization TFT T4 and the second initialization TFT T7, an emission control line EL transferring an emission control signal En to the operation control TFT T5 and the emission control TFT T6, and a data line DL intersecting with the scan line SL and transferring a data signal Dm. The driving voltage line PL may transfer the first power voltage ELVDD to the driving TFT T1, and the initialization voltage line Vint may transfer an initialization voltage for initializing the driving TFT T1 and the pixel electrode.

A driving gate electrode G1 of the driving TFT T1 may be connected to a first storage capacitor plate Cst1 of the storage capacitor Cst, a driving source electrode S1 of the driving TFT T1 may be connected to the driving voltage line PL via the operation control TFT T5, and a driving drain electrode D1 of the driving TFT T1 may be electrically connected to the pixel electrode of the organic light-emitting diode OLED via the emission control TFT T6. The driving TFT T1 may receive the data signal Dm according to a switching operation of the switching TFT T2 to supply a driving current $I_{OLED}$ to the organic light-emitting diode OLED.

A switching gate electrode G2 of the switching TFT T2 may be connected to the scan line SL, a switching source electrode S2 of the switching TFT T2 may be connected to the data line DL, a switching drain electrode D2 of the switching TFT T2 may be connected to the driving source electrode S1 of the driving TFT T1 and at the same time, may be connected to the driving voltage line PL at the lower side via the operation control TFT T5. The switching TFT T2 may be turned on according to the scan signal Sn received through the scan line SL and may perform a switching operation that may transfer the data signal Dm transferred through the data line DL to the driving source electrode S1 of the driving TFT T1.

A compensation gate electrode G3 of the compensation TFT T3 may be connected to the scan line SL, a compensation source electrode S3 of the compensation TFT T3 may be connected to the driving drain electrode D1 of the driving TFT T1 and at the same time may be connected to the pixel electrode of the organic light-emitting diode OLED via the emission control TFT T6, and a compensation drain electrode D3 of the compensation TFT T3 may be connected to the first storage capacitor plate Cst1 of the storage capacitor Cst, a first initialization drain electrode D4 of the first initialization TFT T4, and the driving gate electrode G1 of the driving TFT T1. The compensation TFT T3 may be turned on according to the scan signal Sn received through the scan line SL to electrically connect the driving gate electrode G1 and the driving drain electrode D1 of the driving TFT T1 to each other and to diode-connect the driving TFT T1.

A first initialization gate electrode G4 of the first initialization TFT T4 may be connected to the previous scan line SL-1, a first initialization source electrode S4 of the first initialization TFT T4 may be connected to a second initialization drain electrode D7 of the second initialization TFT T7 and the initialization voltage line Vint, and the first initialization drain electrode D4 of the first initialization TFT T4 may be connected to the first storage capacitor plate Cst1 of the storage capacitor Cst, the compensation drain electrode D3 of the compensation TFT T3, and the driving gate electrode G1 of the driving TFT T1. The first initialization TFT T4 may be turned on according to a previous scan signal Sn-1 transferred through the previous scan line SL-1 to transfer the initialization voltage to the driving gate electrode G1 of the driving TFT T1 and may perform an initialization operation for initializing a voltage at the driving gate electrode G1 of the driving TFT T1.

An operation control gate electrode G5 of the operation control TFT T5 may be connected to the emission control line EL, an operation control source electrode S5 of the operation control TFT T5 may be connected to the driving voltage line PL at the lower side, and an operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, an emission control source electrode S6 of the emission control TFT T6 may be connected to the driving drain electrode D1 of the driving TFT T1 and the compensation source electrode S3 of the compensation TFT T3, and an emission control drain electrode D6 of the emission control TFT T6 may be electrically connected to a second initialization source electrode S7 of the second initialization TFT T7 and the pixel electrode of the organic light-emitting diode OLED.

The operation control TFT T5 and the emission control TFT T6 may be simultaneously turned on according to the emission control signal En transferred through the emission control line EL to transfer the driving voltage ELVDD to the organic light-emitting diode OLED and to allow a driving current $I_{OLED}$ to flow in the organic light-emitting diode OLED.

The second initialization gate electrode G7 of the second initialization TFT T7 may be connected to the previous scan line SL-1, a second initialization source electrode S7 of the second initialization TFT T7 may be connected to the emission control drain electrode D6 of the emission control TFT T6 and the pixel electrode of the organic light-emitting diode OLED, and a second initialization drain electrode D7 of the second initialization TFT T7 may be connected to the first initialization source electrode S4 of the first initialization TFT T4 and the initialization voltage line Vint. The second initialization TFT T7 may be turned on according to the previous scan signal Sn-1 transferred through the previous scan line SL-1 to initialize the pixel electrode of the organic light-emitting diode OLED.

In FIG. 5, the first initialization TFT T4 and the second initialization TFT T7 may be connected to the previous scan line SL-1. As another embodiment, the first initialization TFT T4 may be connected to the previous scan line SL-1 to operate according to the previous scan signal Sn-1, and the second initialization TFT T7 may be connected to a separate signal line (e.g., a post scan line) to operate according to a signal transferred to the signal line.

A second storage capacitor plate Cst2 of the storage capacitor Cst may be connected to the driving voltage line PL, and an opposite electrode of the organic light-emitting diode OLED may be connected to the second power voltage. Accordingly, the organic light-emitting diode OLED may emit light by receiving the driving current $I_{OLED}$ from the driving TFT T1 to display images.

In FIG. 5, the compensation TFT T3 and the first initialization TFT T4 have dual-gate electrodes, but the compensation TFT T3 and the first initialization TFT T4 may each have one gate electrode.

Figure 6:
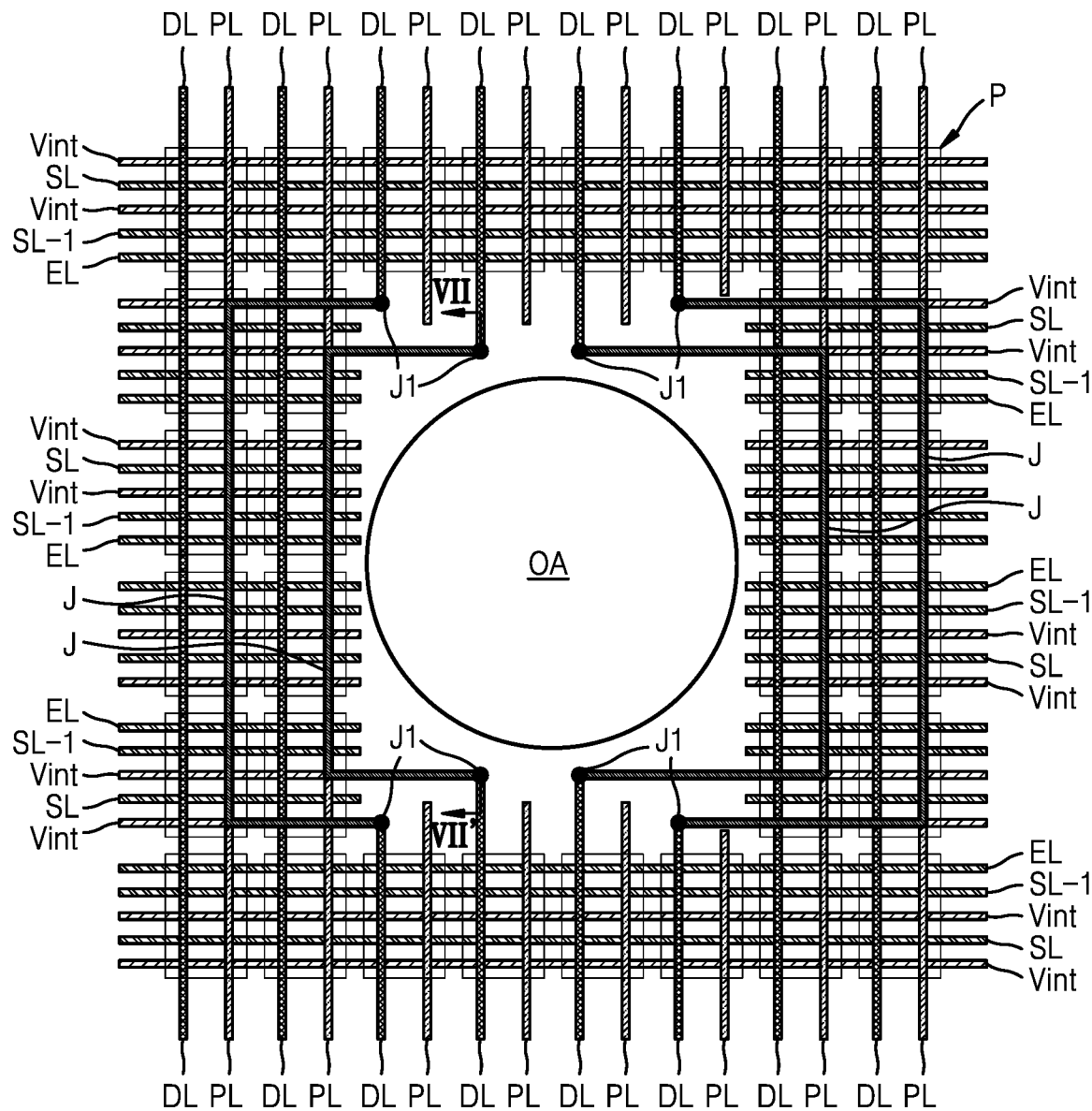
FIG. 6 shows a plan view showing arrangement of wirings around a through area in the display apparatus of FIG. 1.
Figure 7:
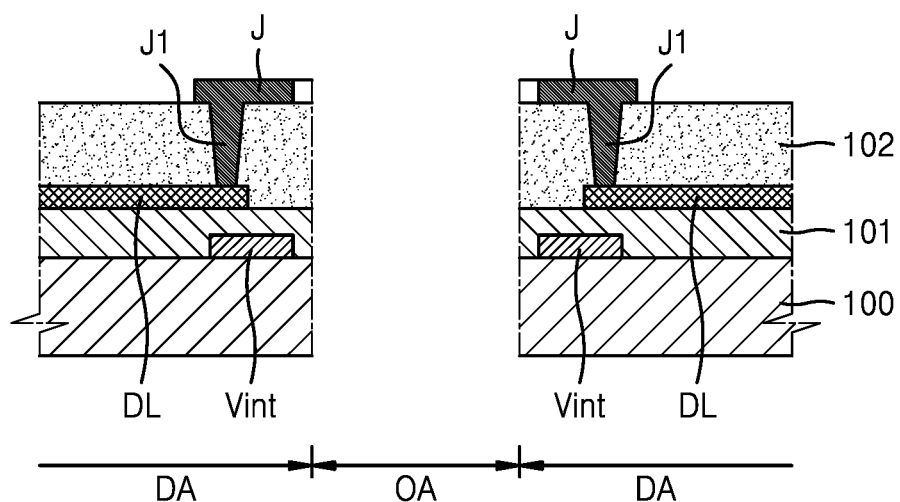
FIG. 7 shows a schematic cross-sectional view taken along a line VII-VII of FIG. 6.

A discussion of wiring structure around the transmission area OA follows below with reference to FIGS. 6 and 7. FIG. 6 shows a plan view of lines around the transmission area OA according to the embodiment, and FIG. 7 shows a schematic cross-sectional view taken along a line VII-VII of FIG. 6.

Referring to FIG. 6, the pixels P may be arranged around the transmission area OA. For example, the transmission area OA may be in the display area DA and the pixels P may surround or be around a periphery of the transmission area.

Due to positioning of the transmission area OA, lines connecting in a first direction, that is, a transverse direction, and a second direction, that is, a longitudinal direction, may be disconnected. In other words, such lines may not be able to extend through the transmission area, causing them to be separated into portions. With respect to the scan lines SL and SL-1 that may be arranged in the first direction from among the signal lines SL, SL-1, EL, and DL and the emission control line EL, they may be disconnected between left and right sides of the transmission area OA. However, because the first scan driving circuit 110 and the second scan driving circuit 120 may apply signals from left and right sides (see FIG. 4), their signals may be achieved and transmitted. For example, the signal lines SL, SL-1, and EL at the left side of the transmission area OA may be connected to the first scan driving circuit 110, and the signal lines SL, SL-1, and EL at the right side may be connected to the second scan driving circuit 120 to transmit signals to respective pixels P regardless of the transmission area OA.

The initialization voltage line Vint in the first direction, and the driving voltage line PL in the second direction may be constant voltage lines that may not transmit signals, but supply constant direct current (DC) voltage. In a case that the initialization voltage line Vint and the driving voltage line PL may be separated as portions thereof due to positioning of the transmission area OA, the voltages may be applied from respective directions. Hereinafter, the constant voltage line in the first direction may be referred to as a first constant voltage line and the constant voltage line in the second direction may be referred to as a second constant voltage line.

Among the signal lines, a signal applied via a data line DL should be uninterrupted. Thus, a data line DL that may be divided due to positioning of the transmission area OA may be re-connected to avoid interruption of the delivery of the data line DL signal, via the bypass line J as shown in FIG.

6. For example, as shown in FIG. 7, the bypass line J may be arched around the transmission area OA to be arranged on an upper layer of the data line DL, wherein the bypass line J and the data line DL may be connected to each other via a contact portion J1. In other words, the portions of the data line DL that may be divided due to positioning of the transmission area OA may be connected to each other while avoiding the transmission area OA. Reference numerals 101 and 102 may denote insulating layers disposed between portions of the data line DL and the bypass line J.

Based on the above, the bypass line J may pass directly over the pixels P. In doing so, the bypass line J may be arranged to follow over the constant voltage lines Vint and PL that pass through each pixel P, so as to overlap or face those constant voltage lines Vint and PL. Thus, the display area DA in the vicinity of the transmission area may be maximized by minimizing a size of a dead space relative to such vicinity. Herein, the term "dead space" may be understood as a space which is devoted to accommodating one or more components that, either singularly or plurally, perform an intended function.

In other words, an additional space, i.e., a dead space, that may otherwise be required for arranging the bypass line J may not be formed around the transmission area OA. Minimization of such additional or dead space may result as the bypass area JPA, including the bypass line J, may overlap the pixels P in the display area DA with respect to a common plane Thus, there may be an insignificant amount of non-display area around the transmission area OA. Although it may be seen that an empty space may be disposed around the transmission area OA in FIG. 6, this showing may exist because the illustrated lines may not be densely shown for convenience of description.

In a case that the bypass line J for the data line DL may be arranged along other signal lines SL, SL-1, and EL, a parasitic capacitor may be formed between the two lines and cause signal interference. To prevent this, the bypass line J may be arranged to follow over, i.e., overlap or face, the first and second constant voltage lines Vint and PL, and not the aforementioned signal lines, in an alternating direction.

For example, the data line DL portion extending above an upper portion of the transmission area OA may be connected to the bypass line J via the contact portion J1 that may be adjacent to the transmission area OA, as shown in FIG. 6. The bypass line J may extend in the first direction to be over the first constant voltage line Vint, and then turn to extend in the second direction to follow the second constant voltage line PL, in order to avoid passing through the transmission area OA. The bypass line J may be bent again to turn in the first direction to be over the first constant voltage line Vint and to be connected to the data line DL portion extending beneath the transmission area OA, via the contact portion J1.

Therefore, divided portion of the data line DL at opposite sides of the transmission area OA may be connected to each other via the bypass line J. Since the bypass line J may be arranged to overlap the constant voltage lines Vint and PL passing through the pixels P with respect to a common plane, generation of unnecessary dead space around the transmission area OA may be effectively prevented without risk of signal interference.

Each pixel P may be longer in the second direction than in the first direction. Therefore, two first constant voltage lines Vint in the first direction may pass through each pixel P. This results since there may be room for additionally arranging the lines Vint due to the shape of the pixel P, which may be elongated in the second direction, such that a path of the first constant voltage line Vint that may be followed by the bypass line J may be formed more densely. In other words, because there may be two first constant voltage lines Vint in the first direction, an amount of the path of the bypass line J that may be necessary to connect opposing portions of the data line DL may be reduced. As a result, a setting of a location of the transmission area OA may otherwise be configured with a greater degree of freedom than in a case where only one first constant voltage lines Vint may pass through a pixel P. For example, in a case that the path of the bypass line J may be caused to increase, the location of the transmission area OA may need to account for the increase, and therefore it may be difficult to set the location of the transmission area OA to be close to an upper edge of the display area DA. However, in a case that the first constant voltage lines Vint may be densely arranged and the path of the bypass line J may be reduced as provided by the embodiment(s) herein, the transmission area OA may be arranged to be relatively closer to the edge of the display area DA in an amount corresponding to a reduced amount of the path.

According to the display apparatus as described above, because the transmission area OA corresponding to various components, such as a sensor, may be in the display area, images may be displayed around the transmission area. Since bypass lines J pass right over the pixels P, there may be no need to ensure an additional or dead space for the bypass lines.

Figure 8:
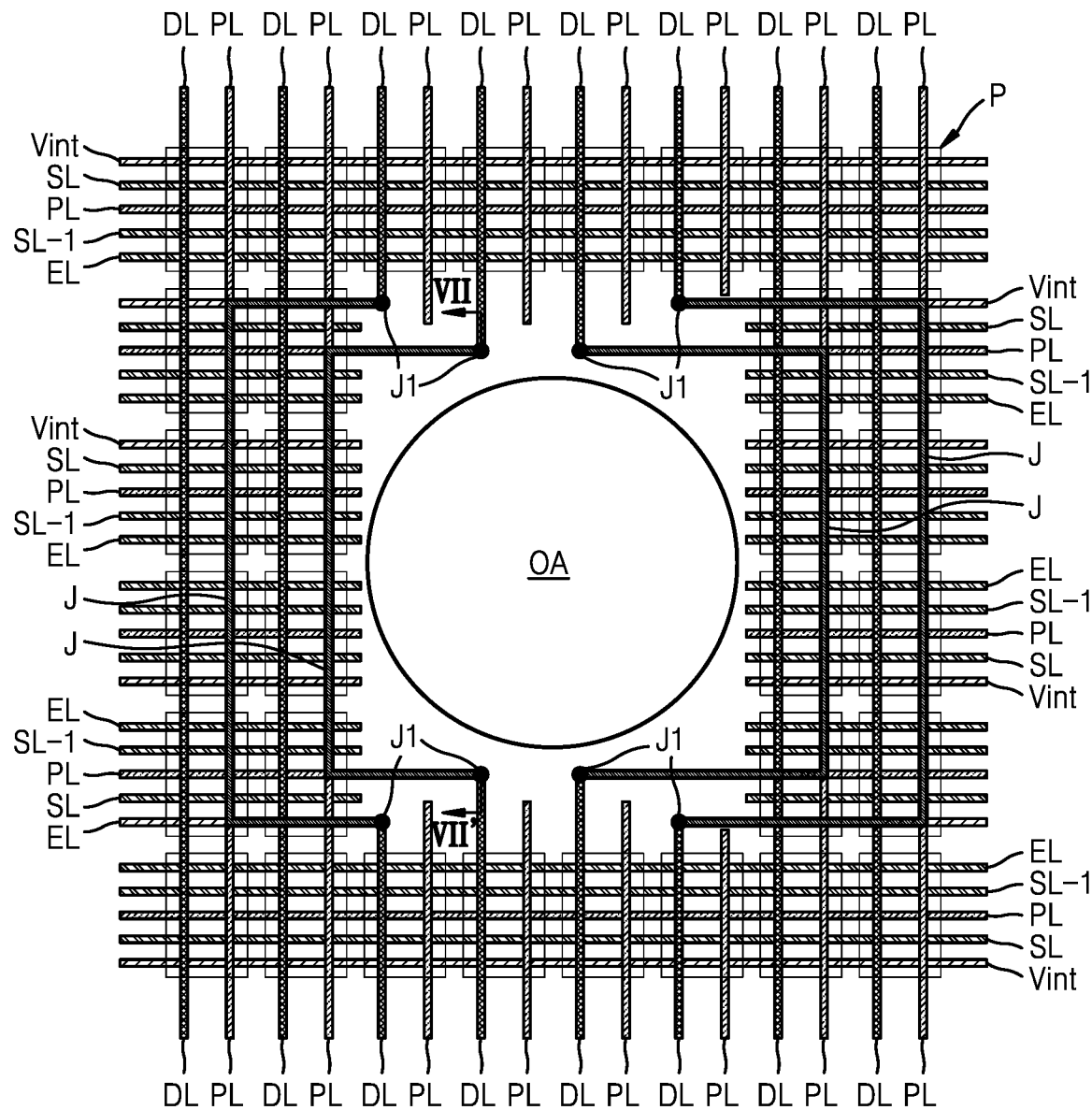
FIG. 8 shows a plan view of a modified structure of the arrangement of wirings in FIG. 6.

As discussed above, two first constant voltage lines passing each pixel may be the initialization voltage lines Vint. However, as shown in FIG. 8, the initialization voltage line Vint and the driving voltage line PL may be the first constant voltage lines. For example, any type of constant voltage line, and not a signal line, may be used as a path to be followed by the bypass line J.

Figure 9:
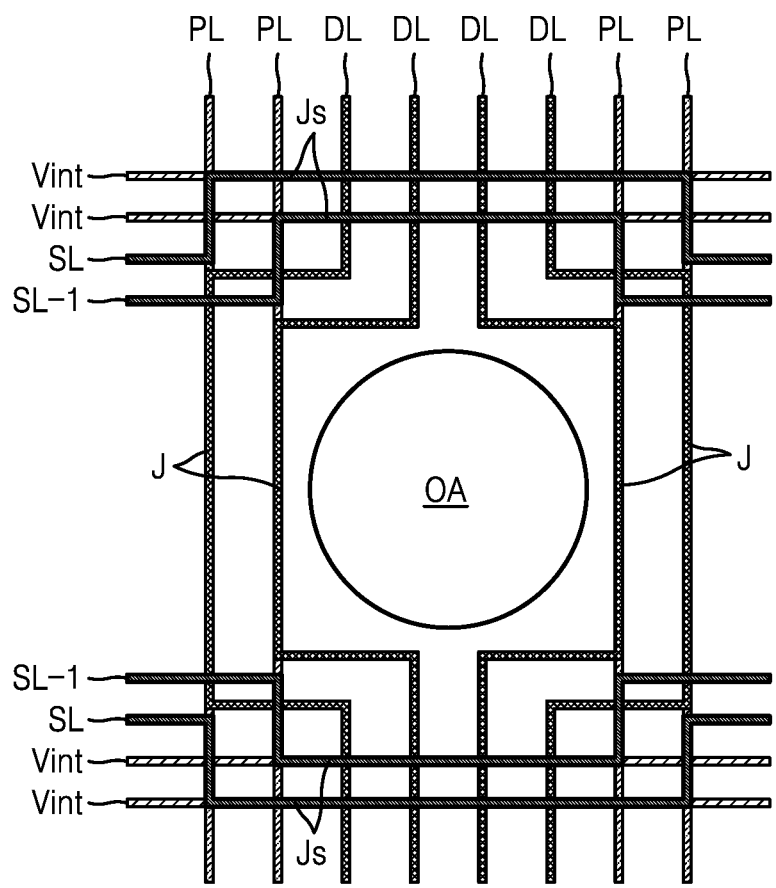
FIG. 9 shows a plan view showing arrangement of wirings around a through area in the display apparatus of FIG. 1.

Also, as discussed herein, the scan lines SL and SL-1 and the emission control line EL may be divided so as to correspond to left and right sides of the transmission area OA, and may be also connected as shown in FIG. 9. In FIG. 9, the scan lines SL and SL-1 are shown so as not to complicate the drawing, and yet the emission control line EL may be also connected in the same manner as the scan lines SL and SL-1. For example, as shown in FIG. 9, the scan lines SL and SL-1 may be connected via a bypass line Js that passes over the initialization voltage line Vint or the driving voltage line PL, that is, a constant voltage line. The bypass line Js may be arranged at a different layer from those of the initialization voltage line Vint, the driving voltage line PL, and the data line DL, with an insulating layer therebetween.

As such, the scan lines SL and SL-1 and the emission control line EL that may be split into portions due to positioning of the transmission area OA may be connected via the bypass line Js As a result, one of the first and second scan driving circuits 110 and 120 may be omitted. The bypass line Js may be arranged to overlap or face the constant voltage lines Vint and PL passing through a pixel P on a common plane to prevent signal jamming.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
a substrate;
a display area on the substrate, and in which pixels are arranged;
a transmission area in the display area, and the pixels being around the transmission area;
a data line and constant voltage lines passing through a first pixel of the pixels, the data line supplying varying data signals and being divided into portions thereof, the constant voltage lines each supplying a respective constant voltage; and
a bypass line connecting the portions of the data line and bypassing the transmission area,
wherein the bypass line overlaps the constant voltage lines.

2. The display apparatus of claim 1, wherein:
the bypass line bypasses the transmission area along a path having an alternating direction.

3. The display apparatus of claim 2, wherein:
the alternating direction comprises a pair of turns.

4. The display apparatus of claim 1, wherein:
the constant voltage lines comprise a first constant voltage line and a second constant voltage line, wherein the first constant voltage line passes through the first pixel of the pixels in a first direction and the second constant voltage line passes through the first pixel of the pixels in a second direction that intersects with the first direction, and
the data line is in parallel with the second constant voltage line in the second direction.

5. The display apparatus of claim 4, wherein:
a plurality of the first constant voltage lines pass through each pixel of a first subset of the pixels in the first direction.

6. The display apparatus of claim 5, wherein:
the plurality of the first constant voltage lines comprise initialization voltage lines that supply initialization voltages to the each pixel.

7. The display apparatus of claim 5, wherein:
the plurality of the first constant voltage lines comprise an initialization voltage line and a driving voltage line, wherein the initialization voltage line supplies an initialization voltage to the each pixel and the driving voltage line supplies a driving voltage to the each pixel.

8. The display apparatus of claim 4, wherein:
the second constant voltage line comprises a driving voltage line that supplies a driving voltage to the each pixel.

9. The display apparatus of claim 4, further comprising:
a plurality of signal lines passing through the first pixel of the pixels in the first direction.

10. The display apparatus of claim 9, wherein:
the plurality of signal lines comprises:
a scan line supplying a scan signal to the each pixel; and
an emission control line supplying an emission control signal to the each pixel.

11. The display apparatus of claim 10, wherein:
the scan line and the emission control line are each divided into two portions, each of which is disposed at an opposite side of the transmission area.

12. The display apparatus of claim 10, wherein:
the two divided portions of each of the scan line and the emission control line are connected to each other via another bypass line overlapping the constant voltage lines.

13. A method of manufacturing a display apparatus, comprising:
forming a display area on a substrate, wherein pixels are arranged in the display area;
forming a transmission area in the display area, in which the pixels are around the transmission area;
arranging a data line and constant voltage lines that pass through a first pixel of the pixels, the data line supplying varying data signals and being divided into portions thereof, the constant voltage lines each supplying a respective constant voltage; and
connecting the portions of the data line via a bypass line that bypasses the transmission area, wherein
the bypass line overlaps the constant voltage lines.

14. The method of claim 13, wherein:
the bypass line bypasses the transmission area along a path having an alternating direction.

15. The method of claim 14, wherein:
the alternating direction comprises a pair of turns.

16. The method of claim 13, wherein:
the constant voltage lines comprise a first constant voltage line and a second constant voltage line, wherein the first constant voltage line passes through the first pixel of the pixels in a first direction and the second constant voltage line passes through the first pixel of the pixels in a second direction that intersects with the first direction, and
the data line is in parallel with the second constant voltage line in the second direction.

17. The method of claim 16, wherein:
a plurality of the first constant voltage lines pass through each pixel of a first subset of the pixels in the first direction.

18. The method of claim 17, wherein:
the plurality of the first constant voltage lines comprise initialization voltage lines that supply initialization voltages to the each pixel.

19. The method of claim 17, wherein:
the plurality of first constant voltage lines comprise an initialization voltage line and a driving voltage line, wherein the initialization voltage line supplies an initialization voltage to the each pixel and the driving voltage line supplies a driving voltage to the each pixel.

20. The method of claim 16, wherein:
the second constant voltage line comprises a driving voltage line that supplies a driving voltage to the each pixel.

* * * * *